United States Patent
Kim et al.

(10) Patent No.: US 11,791,373 B2
(45) Date of Patent: Oct. 17, 2023

(54) DIELECTRIC THIN FILM, CAPACITOR INCLUDING THE DIELECTRIC THIN FILM, AND METHOD FOR MANUFACTURING THE DIELECTRIC THIN FILM

(71) Applicant: Samsung Electronics Co., Ltd., Suwon-si (KR)

(72) Inventors: Hyungjun Kim, Suwon-si (KR); Changsoo Lee, Seoul (KR); Chan Kwak, Yongin-si (KR); Euncheol Do, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1 day.

(21) Appl. No.: 17/306,310

(22) Filed: May 3, 2021

(65) Prior Publication Data
US 2022/0165840 A1    May 26, 2022

(30) Foreign Application Priority Data

Nov. 24, 2020  (KR) .................. 10-2020-0159091

(51) Int. Cl.
 *H01L 21/00* (2006.01)
 *H01L 49/02* (2006.01)

(52) U.S. Cl.
 CPC .............. *H01L 28/56* (2013.01); *H01L 28/65* (2013.01)

(58) Field of Classification Search
 CPC .................. H01L 28/56; H01L 28/65
 See application file for complete search history.

(56) References Cited

U.S. PATENT DOCUMENTS

| | | | |
|---|---|---|---|
| 10,056,394 B1 * | 8/2018 | Ruediger | H01L 21/02181 |
| 2008/0118731 A1 | 5/2008 | Srinivasan et al. | |
| 2010/0226067 A1 * | 9/2010 | Osada | H01L 21/022 156/60 |

(Continued)

FOREIGN PATENT DOCUMENTS

| | | |
|---|---|---|
| KR | 10-1123433 B1 | 3/2012 |
| KR | 10-2020-0099406 A | 8/2020 |
| WO | WO-2019-079062 A1 | 4/2019 |

OTHER PUBLICATIONS

Young-Shin Lee et al., "Dielectric properties of single crystal Sr2Nb3O10 dielectric nanosheet thin films by electrophoretic deposition (EPD) and post deposition treatments," Journal of Alloys and Compounds 711 (2017), pp. 51-57, Mar. 31, 2017.

(Continued)

*Primary Examiner* — Richard A Booth

(74) *Attorney, Agent, or Firm* — HARNESS, DICKEY & PIERCE, P.L.C.

(57) ABSTRACT

Provided is a method of preparing a dielectric film having a nanoscale three-dimensional shape and including an oxide, the oxide represented by $R_A M_B O_C$ where R is a divalent element and M is a pentavalent element, the method may include synthesizing a target material, the target material including the divalent element and the pentavalent element;

(Continued)

and forming the oxide by depositing the divalent element and the pentavalent element, from the target material, onto a substrate such that the oxide includes a perovskite-type crystal structure, $1.3<B/A<1.7$, and $9.0 \leq C<10.0$.

8 Claims, 20 Drawing Sheets

(56) References Cited

U.S. PATENT DOCUMENTS

| | | | |
|---|---|---|---|
| 2021/0110975 A1* | 4/2021 | Kim | H01G 4/1209 |
| 2021/0118980 A1* | 4/2021 | Park | H01L 27/10835 |
| 2021/0134941 A1 | 5/2021 | Kim et al. | |

OTHER PUBLICATIONS

A. Hardy et al., "Strontium niobate high-k dielectrics: Film deposition and material properties," Acta Materialia, vol. 58, No. 1, pp. 216-225, Sep. 30, 2009.

Yeji Song et al., "Massive hydration-driven swelling of layered perovskite niobate crystals in aqueous solutions of organo-ammonium bases," Dalton Trans., 2018, 47, pp. 3022.3028, Oct. 23, 2017.

Bao-Wn Li et al., "Atomic Layer Engineering of High-k Ferroelectricity in 2D Perovskites," J. Am. Chem. Soc. 2017, 139, pp. 10868-10874, Jul. 12, 2017.

Minoru Osada et al., "Two-Dimensional Dielectric Nanosheets: Novel Nanoelectronics From Nanocrystal Building Blocks," Adv. Mater. 2012, 24, pp. 210-228, Oct. 14, 2011.

M. Fang et al., "Layer-by-Layer Growth and Condensation Reactions of Niobate and Titanoniobate Thin Films," Chem. Mater. 1999, vol. 11, No. 6, pp. 1526-1532, May 6, 1999.

P. P. Leshchenko et al., "SrO—Nb2O5; Fig. 92-006-System SrO—Nb2O5," SSSR, Neorg. Mater., 18 [7] 1202-1205 (1982);*Inorg. Mater. (Engl. Transl.)*, 18 [7] 1013-1016 (1982), 1982.

Chunlin Chen et al., "Atomic and electronic structure of the SrNbO3/SrNbO3.4 interface," Applied Physics Letters 105, 221602 (2014), Dec. 1, 2014.

Y. Nezu et al., "Solid-phase epitaxial film growth and optical properties of a ferroelectric oxide, Sr2Nb2O7," J. Appl. Phys. 122 135305 (2017), Oct. 4, 2017.

* cited by examiner

DIELECTRIC THIN FILM, CAPACITOR INCLUDING THE DIELECTRIC THIN FILM, AND METHOD FOR MANUFACTURING THE DIELECTRIC THIN FILM

CROSS-REFERENCE TO RELATED APPLICATION

This application is based on and claims priority under 35 U.S.C. § 119 to Korean Patent Application No. 10-2020-0159091, filed on Nov. 24, 2020, in the Korean Intellectual Property Office, the disclosure of which is incorporated by reference herein in its entirety.

BACKGROUND

1. Field

The present disclosure relates to a dielectric thin film, a capacitor including the dielectric thin film, and a method for manufacturing the dielectric thin film.

2. Description of the Related Art

Along with a recent rapid trend toward high-functionality, high-efficiency, small, and light electronic devices, small and high-performance electronic components have been rapidly developed, and the adoption of highly reliable electronic components has also significantly increased.

Capacitors are an example of such electronic components. For high capacitance, capacitors are required to have sufficiently high permittivity, which is related to the amount of charge that the dielectric of a capacitor can store per unit area. Along with a trend toward integration of electronic components, the structures of electronic components have been improved by improving process capability in addition to improving the physical properties of electronic components, but there are limits to improving the physical structures of electronic components, thereby requiring the development of new materials having physical properties superior to those of existing materials.

Research has been conducted into binary oxides such as hafnium dioxide ($HfO_2$), zirconium oxide ($ZrO_2$), tantalum oxide ($Ta_2O_5$), and titanium dioxide ($TiO_2$), and perovskite-based oxides such as strontium titanate ($SrTiO_3$) and (Ba, Sr)$TiO_3$ as materials having high permittivity for replacing silicon oxide and aluminum oxide, which have been used as dielectrics of capacitors.

In particular, perovskite-based, two-dimensional nanosheets may be used as dielectrics for capacitors. However, the permittivity of such perovskite-based two-dimensional nanosheets decreases because of organic materials which may be adsorbed on the surfaces of the perovskite-based two-dimensional nanosheets during manufacturing processes. Thus, improvements are required for addressing this problem. Furthermore, to use perovskite-based two-dimensional nanosheets as dielectrics of capacitors, a process of laminating/coating substrates with perovskite-based two-dimensional nanosheets is required, and to this end, the development of bottom-up process techniques is beneficial.

SUMMARY

Provided are dielectric thin films having improved dielectric constant properties.

Provided are capacitors including the dielectric thin films.

Provided are methods of preparing the dielectric thin films.

Additional aspects will be set forth in part in the description which follows and, in part, will be apparent from the description, or may be learned by practice of the presented embodiments of the disclosure.

According to an aspect of an embodiment, there is provided a method of preparing a dielectric having a nanoscale three-dimensional shape and including an oxide, the oxide represented by $R_AM_BO_C$ where R is a divalent element and M is a pentavalent element, the method may include synthesizing a target material, the target material including the divalent element and the pentavalent element; and forming the oxide by depositing the divalent element and the pentavalent element, from the target material, onto a substrate such that the oxide includes a perovskite-type crystal structure, $1.3<B/A<1.7$, and $9.0 \leq C<10.0$.

A, B and C may be controlled such that the dielectric film may be electrically neutral.

The target material may include $RM_2O_6$ and $R_2M_2O_7$ mixed at a molar ratio of 2:1.

The divalent element may be strontium (Sr), and the pentavalent may be niobium (Nb).

The divalent element may include at least one of calcium (Ca), strontium (Sr), barium (Ba), or a combination thereof.

The pentavalent element may include at least one of vanadium (V), niobium (Nb), tantalum (Ta), or a combination thereof.

The substrate may have a lattice misfit of about 1% or less with respect to the oxide.

The substrate may have a lattice constant of about 3.85 Å to about 3.95 Å.

The substrate may include $SrTiO_3$ or Nb-doped $SrTiO_3$.

The depositing target material may include at least one of pulsed laser deposition (PLD), sputtering, and molecular beam epitaxy (MBE).

The depositing of the target material may include the substrate having a temperature of about 800° C. to about 1000° C.

According to an aspect of another embodiment, there is provided a dielectric having a three-dimensional nanoscale shape. The dielectric may an oxide including a perovskite-type crystal structure, the oxide may be represented by $R_AM_BO_C$ where R is a divalent element, M is a pentavalent element, $1.3<B/A<1.7$, and $9.0 \leq C<10.0$.

The oxide may be electrically neutral.

In the formula of $R_AM_BO_C$, the divalent element may include at least one of calcium (Ca), strontium (Sr), barium (Ba), or a combination thereof.

In the formula $R_AM_BO_C$, the pentavalent element may include at least one of niobium (Nb), vanadium (V), tantalum (Ta), or a combination thereof.

The oxide may have a lattice constant of about 3.85 Å to about 3.95 Å.

The oxide may have a thickness of about 1.5 nm to about 1000 nm.

According to an aspect of another embodiment, a capacitor may include a first electrode; a second electrode; and a dielectric as described above between the first electrode and the second electrode.

The capacitor may further include a seed layer between the second electrode and the oxide; the seed layer may have a lattice misfit of 1% or less with respect to the oxide.

The second electrode may serve as a seed layer for the dielectric thin film, and the second electrode may have a lattice misfit of about 1% or less with respect to the oxide.

BRIEF DESCRIPTION OF THE DRAWINGS

The above and other aspects, features, and advantages of some examples embodiments of the disclosure will be more apparent from the following description taken in conjunction with the accompanying drawings, in which.

DETAILED DESCRIPTION

Figure 1:
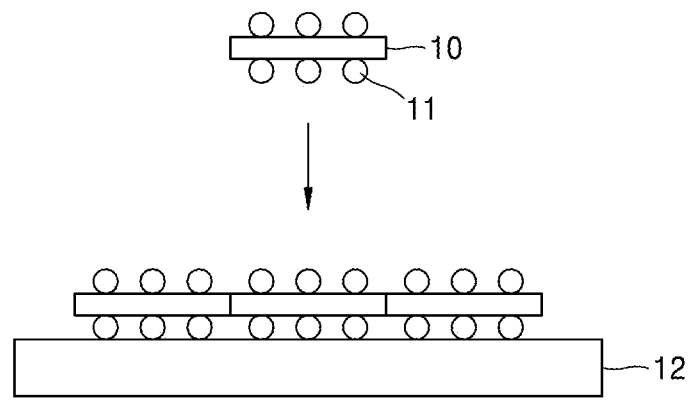
FIG. 1 is a view schematically illustrating a method of forming a dielectric multilayer thin film according to a comparative example.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the drawings, the sizes of elements may be exaggerated for clarity of illustration.

In the following description, when an element is referred to as being "above" or "on" another element, it may be directly on the other element while making contact with the other element or may be above the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements. When the terms "about" or "substantially" are used in this specification in connection with a numerical value, it is intended that the associated numerical value includes a manufacturing tolerance (e.g., ±10%) around the stated numerical value.

An element referred to with the definite article or a demonstrative pronoun may be construed as the element or the elements even though it has a singular form. Operations of a method may be performed in an appropriate order unless explicitly described in terms of order or described to the contrary. Operations of a method are not limited to the stated order thereof.

It will be understood that although terms such as "first" and "second" are used herein to describe various elements, these elements should not be limited by these terms. Terms are only used to distinguish one element from other elements.

"Perovskite" is a generic term for compounds in which a first cation is at position (0,0,0), a second cation is at position ($½,½,½$), and an anion is at position ($½,½,0$) in each unit cell. It is understood that perovskite includes not only $CaTiO_3$ having an ideal symmetrical structure but also other compounds having a twisted structure with relatively lower symmetry.

As the degree of integration of semiconductor memory devices increases, capacitors having small sizes but high capacitance are beneficial. In particular, the capacitance of capacitors increases in proportion to the permittivity of the dielectric of the capacitors. Therefore, research has been actively conducted into dielectrics of capacitors.

Figure 2:
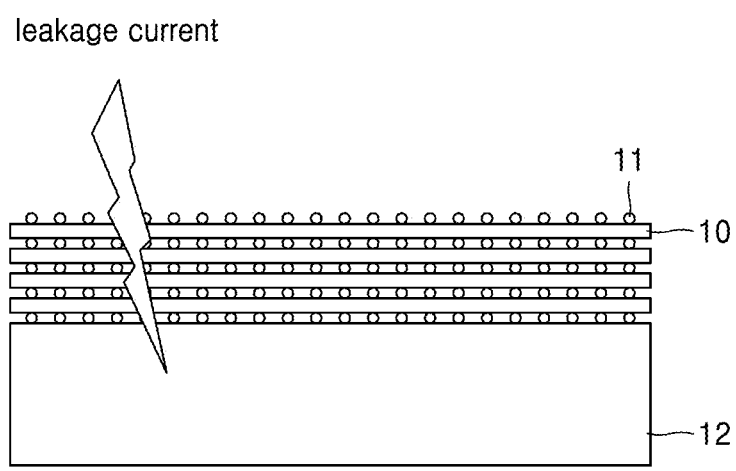
FIG. 2 is a view schematically illustrating the structure of the dielectric multilayer thin film formed by the method of the comparative example illustrated in FIG. 1.

A dielectric multilayer thin film used as a dielectric of a capacitor may be prepared by stacking two-dimensional nanosheets 10 on a substrate 12 in a layered structure as shown in FIG. 1. However, the dielectric multilayer thin film prepared as described above may have low permittivity due to an organic material 11 on the surface of the dielectric multilayer thin film and/or between layers of the dielectric multilayer thin film, and thus. For example, referring to FIG. 2, when a plurality of two-dimensional nanosheets 10 is stacked on the substrate 12, an organic material 11 may be formed between the two-dimensional nanosheets 10. This may be because the two-dimensional nanosheets 10, having negative electrode characteristics, are coupled to the organic material 11 having positive electrode characteristics. In this case, current leakage may occur at the interfaces between the two-dimensional nanosheets 10, and thus, the properties of the dielectric multilayer thin film may deteriorate.

The following description will be given of a method of preparing a dielectric, according to some embodiments, wherein the dielectric has a nanoscale three-dimensional structure and includes an oxide represented by a formula of $R_A M_B O_C$ (where R is a divalent element, and M is a pentavalent element) and having a perovskite-type crystal structure.

Figure 3:
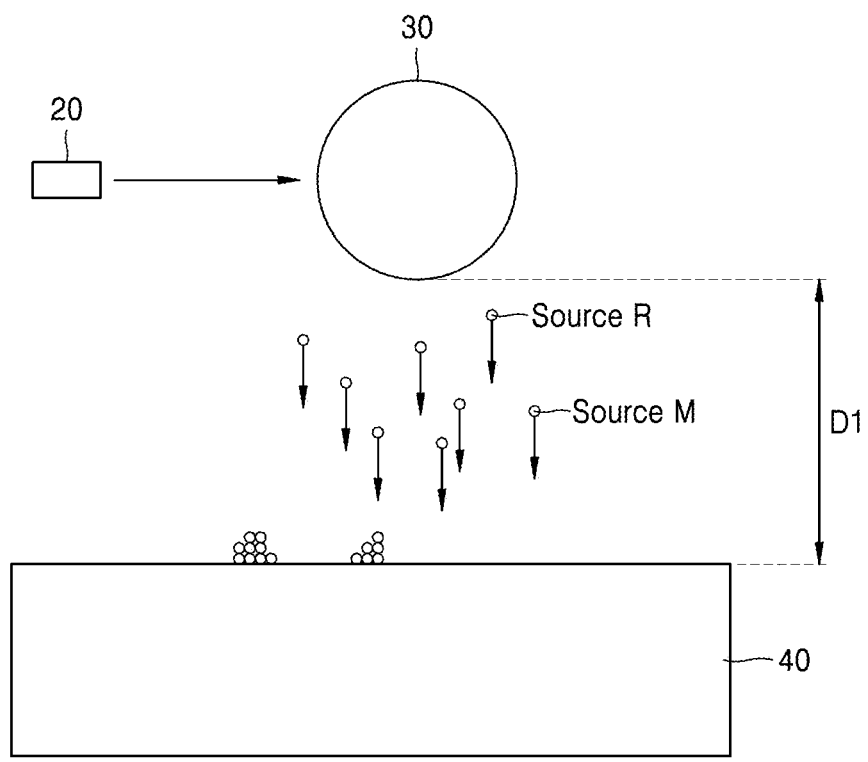
FIG. 3 is a schematic illustration of a process of forming a target material and sources in a method of forming a dielectric according to some embodiments.
Figure 4:
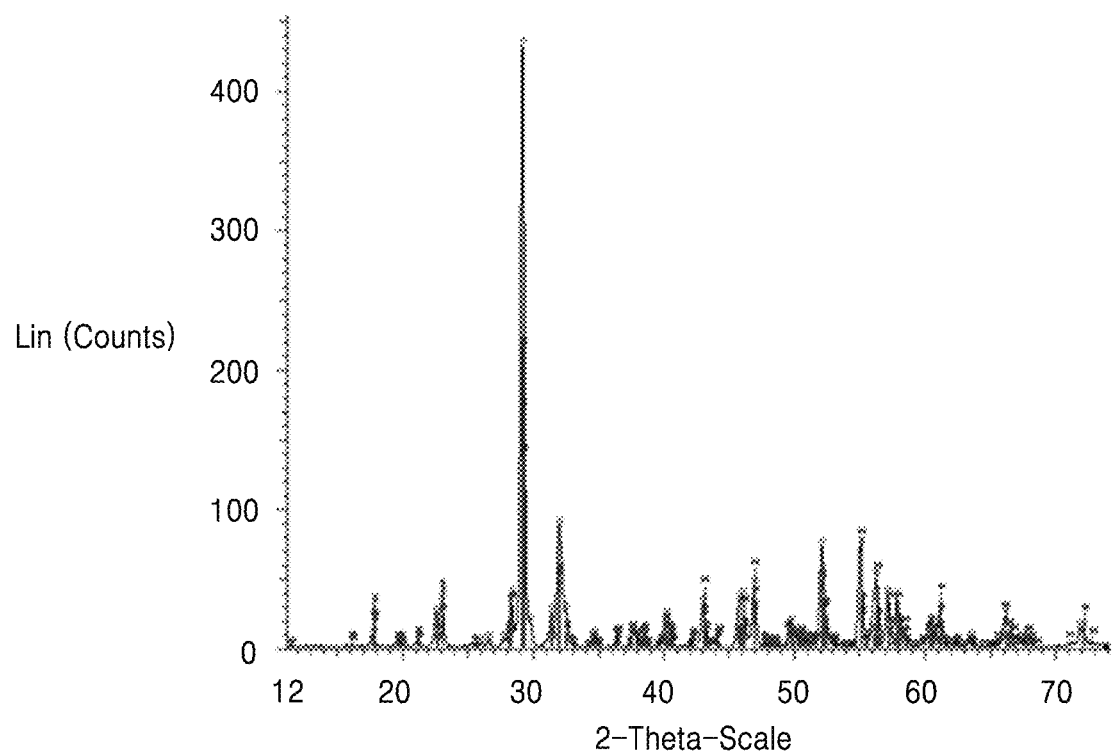
FIG. 4 is a graph illustrating the X-ray diffraction (XRD) spectrum of the target material illustrated in FIG. 3 according to some embodiments.
Figure 5:
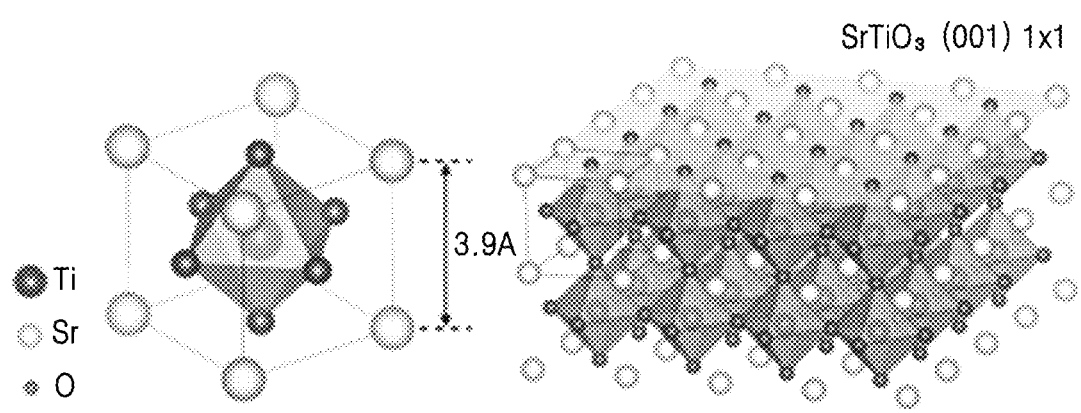
FIG. 5 is a view schematically illustrating the structure of a material included in a substrate.
Figure 6:
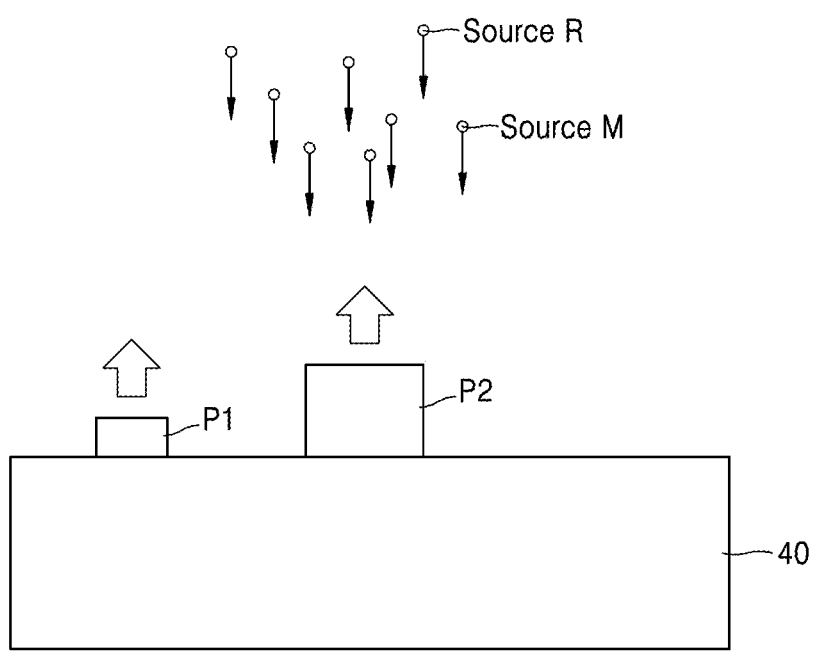
FIG. 6 is a view schematically illustrating a state in which sources generated from the target material are grown on the substrate in the method of forming a dielectric according to some embodiments.
Figure 7:
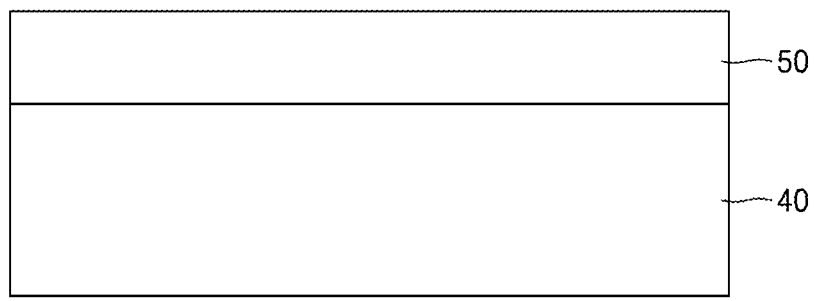
FIG. 7 is a view schematically illustrating the structure of a dielectric formed by the method of forming a dielectric according to some embodiments.

FIG. 3 is a schematic illustration of a process of forming a target material 30 and sources (R, M, etc.) in the method of forming a dielectric according to some embodiments. FIG. 4 is a graph illustrating the X-ray diffraction (XRD) spectrum of the target material 30 of the example embodiments shown in FIG. 3. FIG. 5 is a view schematically illustrating the structure of a material included in a substrate 40. FIG. 6 is a view schematically illustrating a state in which the sources (R, M, etc.) generated from the target material 30 are grown on the substrate 40 in the method of forming a dielectric according to the example embodiments. FIG. 7 is a view schematically illustrating the structure of a dielectric 50 formed by the method of forming a dielectric according to the example embodiments.

A dielectric to be formed by the method may include an oxide represented by a formula of $R_A M_B O_C$ (where R is a divalent element, and M is a pentavalent element) and having a perovskite-type crystal structure. In some embodiments, the dielectric may be and/or include a dielectric thin film.

Referring to FIG. 3, a dielectric may be formed on the substrate 40 through a pulsed laser deposition (PLD) process. However, the process is not limited thereto, and the dielectric may be formed on the substrate 40 through another process, for example, a sputtering process and/or a molecular beam epitaxy (MBE) process.

According to some embodiments, the method of preparing a dielectric may include a process of synthesizing the target material 30, wherein the formula $R_A M_B O_C$ is satisfied by the conditions of $1.3 < B/A < 1.7$ and $9.0 \leq C < 10.0$. In some examples, when the conditions of $1.3 < B/A < 1.7$ and $9.0 \leq C < 10.0$ are satisfied, the dielectric represented by the formula of $R_A M_B O_C$ may be electrically neutral.

For example, in some embodiments, synthesizing the target material 30 may include synthesizing a material comprising one or more oxides comprising the divalent element R and the pentavalent element M. In some embodiments, the one or more oxides may include different molar ratios of the divalent element R, the pentavalent element M, and oxygen. The target material 20 may be, for example, a powder, a compressed powder, an amorphous solid, and/or polycrystalline solid.

The electrical properties of the dielectric comprising the oxide represented by $R_A M_B O_C$ may vary depending on the process and/or according to the values of A, B, and C. In this case, the values of A, B, and C may be selected such that the dielectric comprising an oxide represented by the formula $R_A M_B O_C$ may be electrically neutral. For example, A may be 2, B may be 3, and C may be 9.5. In this case, since R is a divalent cation and M is a pentavalent cation, the oxidation number of $R_A M_B O_C$ may be 0 ($[=(2\times2)+(5\times3)+((-2)\times9.5)]$), and thus, the dielectric represented by the formula of $R_A M_B O_C$ may be electrically neutral.

In some embodiments, the dielectric comprising an oxide represented by $R_A M_B O_C$ may include a mixture of oxides represented by the formula $R_A M_B O_C$. For example, in another example, a target material 30 including a material in which $RM_2O_7$ and $R_2M_2O_7$ are mixed at a molar ratio of 2:1 may be synthesized to form a dielectric represented by $R_A M_B O_C$ satisfying the conditions of $1.3 < B/A < 1.7$ and $9.0 \leq C < 10.0$. For example, the target material 30 may be prepared by solid phase synthesis. In this case, since R is a divalent cation and M is a pentavalent cation, the oxidation number of the material in which $RM_2O_6$ and $R_2M_2O_7$ are mixed at a molar ratio of 2:1 may be 0 ($=2\times1+5\times2+(-)2\times6+2\times2+5\times2+(-)2\times7$). Therefore, the dielectric, which is formed from the target material 30 including a material in which $RM_2O_6$ and $R_2M_2O_7$ are mixed at a molar ratio of 2:1, may be electrically neutral. When the target material 30 includes a mixture of oxides (e.g., $RM_2O_6$ and $R_2M_2O_7$ mixed at a molar ratio of 2:1), the dielectric formed from the target material 30 may be represented by a weighted averaged formula (e.g., $R_2M_3O_{9.5}$). As described above, the dielectric constant of the dielectric may be greater when the R:M ratio of a material included in the dielectric is 2:3 than when the R:M ratio of a material included in the dielectric is not 2:3.

In the formula of $R_A M_B O_C$, R may include, for example, at least one of calcium (Ca), strontium (Sr), barium (Ba), and/or a combination thereof, and M may include, for example, at least one of vanadium (V), niobium (Nb), tantalum (Ta), and/or a combination thereof. For example, R may be strontium (Sr), and M may be niobium (Nb). In this case, when the target material 30 includes a material in which $RM_2O_6$ and $R_2M_2O_7$ are mixed at a molar ratio of 2:1, the target material 30 may include a material in which $SrNb_2O_6$ and $Sr_2Nb_2O_7$ are mixed at a molar ratio of 2:1. The X-ray diffraction spectrum of the target material 30 including a material in which $SrNb_2O_6$ and $Sr_2Nb_2O_7$ are mixed at a molar ratio of 2:1 as described above may have a tendency as shown in FIG. 4. The dielectric formed from the target material 30 may include $Sr_2Nb_3O_{9.5}$. The lattice constant of the dielectric including $Sr_2Nb_3O_{9.5}$ may be within the range of about 3.85 Å to about 3.95 Å.

However, the present disclosure is not limited thereto, and the components of the target material 30 and the mixing ratio of the components may be variously selected. For example, the target material 30 may be appropriately selected to form a dielectric represented by the formula of $R_A M_B O_C$ satisfying the conditions of $1.3 < B/A < 1.7$ and $9.0 \leq C < 10.0$. In addition, A, B, and C may be selected such that the dielectric represented by the formula of $R_A M_B O_C$ may be electrically neutral.

In addition, according to some embodiments, the method of preparing a dielectric may include a process of depositing the target material 30 on the substrate 40 after forming the target material 30. For example, after the target material 30 is formed, a laser beam may be emitted from a laser light source 20 to the target material 30 to generate sources (R, M, etc.) for forming a dielectric. For example, the laser beam may be used to ablate the surface of the target material 20 to form the sources (R, M, etc.). The sources (R, M, etc.) may deposited onto the substrate 40, and the oxide may be grown on the substrate 40. For example, the sources (R, M, etc.) may be epitaxially grown on the substrate 40.

In some embodiments, the target material may be held over the substrate at a distance D1. As will be described below in further detail, the energy density of the laser beam and/or the distance D1 may be adjusted to control the rate of deposition. The rate of deposition may, for example, effect the surface roughness, permittivity, and crystalline structure of the dielectric. In some embodiments, the process of forming the dielectric may be considered a bottom-up process.

A substrate having a lattice misfit of about 1% or less with the dielectric to be formed may be used as the substrate 40. Therefore, the dielectric may be epitaxially grown on the substrate 40. In addition, the temperature of the substrate 40 during the process may be about 800° C. to about 1000° C. For example, in the case where the lattice constant of the dielectric (e.g., including $Sr_2Nb_3O_{9.5}$) is within the range of about 3.85 Å to about 3.95 Å, the lattice constant of the substrate 40 may be within the range of about 3.85 Å to about 3.95 Å. For example, the substrate 40 may include at least one of $SrTiO_3$ and/or Nb-doped $SrTiO_3$. The structure of $SrTiO_3$ may be as shown in FIG. 5 and may have a lattice misfit of about 1% or less with a perovskite structure according to some embodiments.

Referring to FIG. 6, while a laser beam is emitted from the laser light source 20 to the target material 30 (as in FIG. 3), sources (R, M, etc.) may be grown on the substrate 40, and therefore, a plurality of three-dimensional crystal structures P1 and P2 may be formed. Unlike the layered structure shown in FIG. 2, which includes the two-dimensional nanosheets 10 and the organic material 11 formed between the two-dimensional nanosheets 10, the crystal structures P1 and P2 may be three-dimensional structures formed by growing unit lattices having a perovskite structure. The crystal structures P1 and P2 may be electrically neutral.

Referring to FIG. 7, as the process proceeds, more crystal structures P1 and P2 may be gradually formed on the substrate 40, and the crystal structures P1 and P2 may be coupled to each other such that a dielectric 50 having a nanoscale three-dimensional shape may be formed on the substrate 40. Unlike the layered structure shown in FIG. 2, the dielectric 50 may have a three-dimensional shape and may thus have improved reliability/stability. For example, the thickness of the dielectric 50 may be in the range of about 1.5 nm to about 1000 nm.

Figure 8:
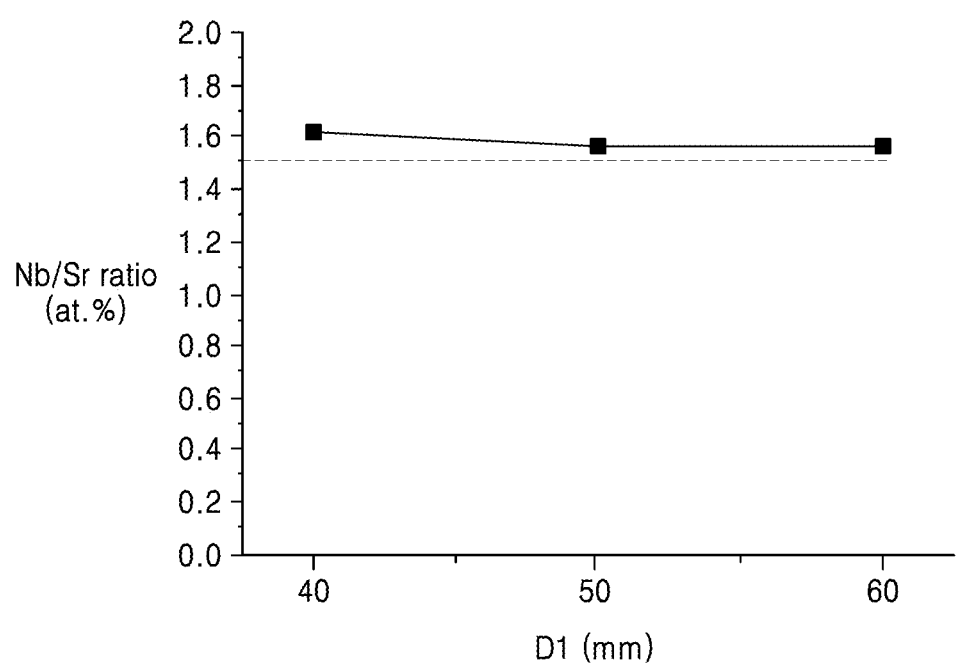
FIG. 8 is a graph schematically illustrating an example chemical composition ratio of the dielectric of FIG. 7, which is formed by the method of forming a dielectric according to some embodiments.

FIG. 8 is a graph schematically illustrating an example chemical composition ratio of the dielectric 50 of FIG. 7, which is formed by the method of forming a dielectric according to some embodiment.

Referring to FIG. 8, when the dielectric 50 is represented by the formula of $R_AM_BO_C$ where R is strontium (Sr) and M is niobium (Nb), the composition ratio of Nb to Sr (Nb/Sr) may be close to about 1.5. In this case, the composition ratio of Nb to Sr (Nb/Sr) in the dielectric 50 may vary according to the distance D1 between the target material 30 and the substrate 40 shown in FIG. 3. For example, when the distance D1 between the target material 30 and the substrate 40 is about 40 mm to about 60 mm, the composition ratio of Nb to Sr (Nb/Sr) in the dielectric 50 may be greater than about 1.5 but less than about 1.6.

Figure 9:
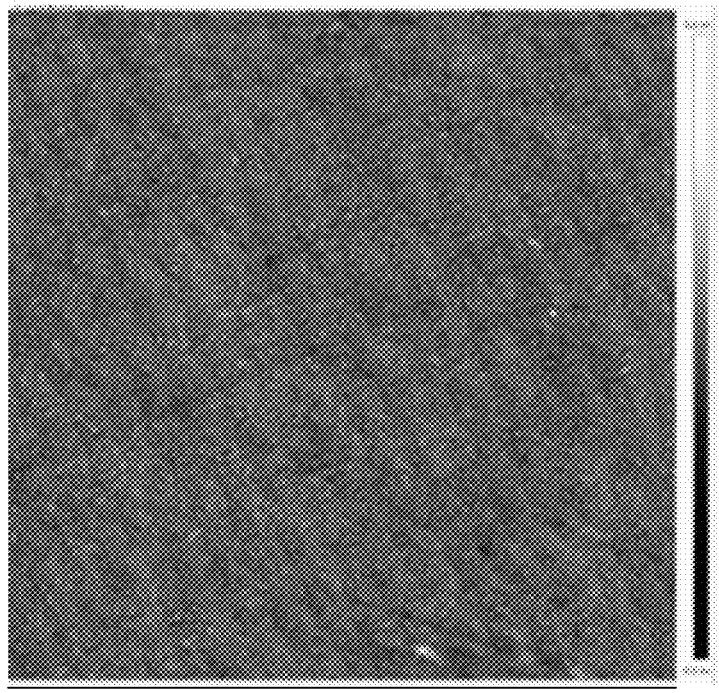
FIG. 9 is an atomic force microscopy (AFM) cross-sectional view illustrating a surface of the dielectric of FIG. 7, which is formed by the method of forming a dielectric according to some embodiments.

FIG. 9 is an atomic force microscopy (AFM) cross-sectional view illustrating a surface of the dielectric 50 of FIG. 7, which is formed by the method of forming a dielectric according to some embodiments.

Referring to FIG. 9, the surface roughness Rq of the dielectric 50 of FIG. 7, which is formed by the method of forming a dielectric according to some embodiments, may be about 3.2 Å. In addition, the dielectric 50 may have a step terrace structure. The step terrace structure may be evidence that the dielectric 50 was epitaxially grown on the substrate 40.

Figure 10:
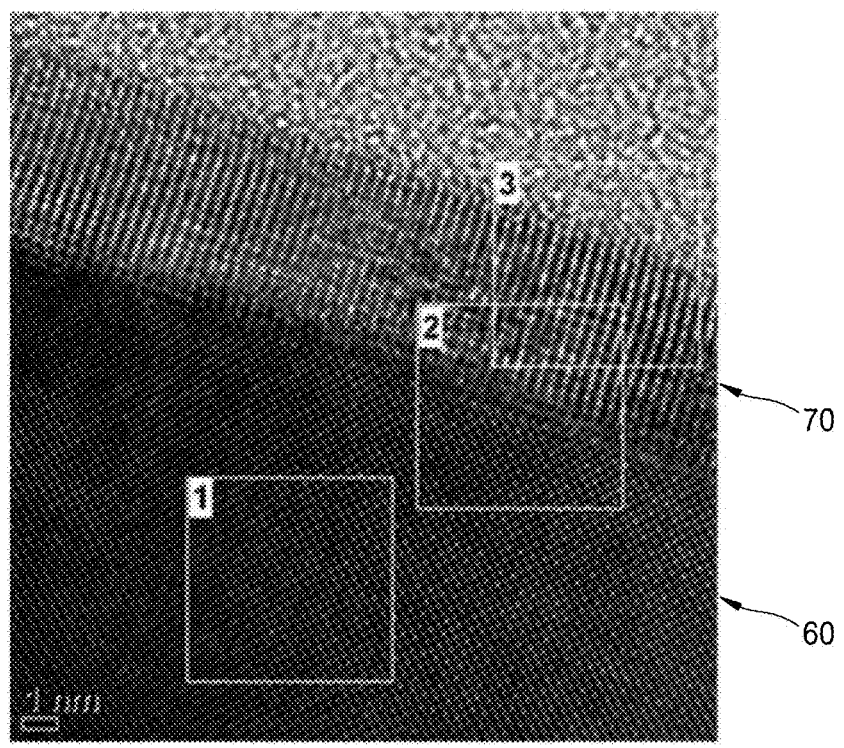
FIG. 10 is a transmission electron microscopy (TEM) cross-sectional view illustrating the substrate and the dielectric of FIG. 7, which is formed by the method of forming a dielectric according to some embodiments.
Figure 11:
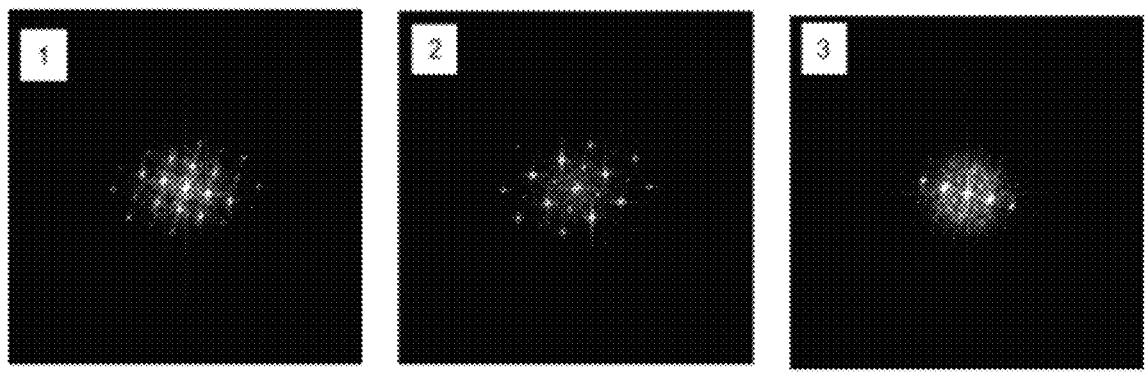
FIG. 11 is an enlarged view illustrating partial regions of the cross-sectional view shown in FIG. 10.

FIG. 10 is a transmission electron microscopy (TEM) cross-sectional view illustrating a substrate 60 and a dielectric 70, which is formed by the method of forming a dielectric according to some embodiments. FIG. 11 is an enlarged view illustrating partial regions of the cross-sectional view of FIG. 10. The dielectric 70 and the substrate 60 shown in FIG. 10 may be substantially the same as the dielectric 50 and the substrate 40, which are shown in FIG. 7, respectively.

Referring to FIG. 10, the dielectric 70 may be deposited on the substrate 60 while being epitaxially grown on the substrate 60. A first region 1 shows a cross-section of the substrate 60. A second region 2 shows a cross-section of a portion between the substrate 60 and the dielectric 70. A third region 3 shows a cross-section of the dielectric 70. As shown in FIG. 11, the arrangement structure of the substrate 60 in the first region 1 may be substantially the same as the arrangement structure of the dielectric 70 in the third region 3. In other words, the lattice constant of the substrate 60 may be substantially the same as the lattice constant of the dielectric 70, and thus, the dielectric 70 may be epitaxially grown and deposited on the substrate 60.

Figure 12:
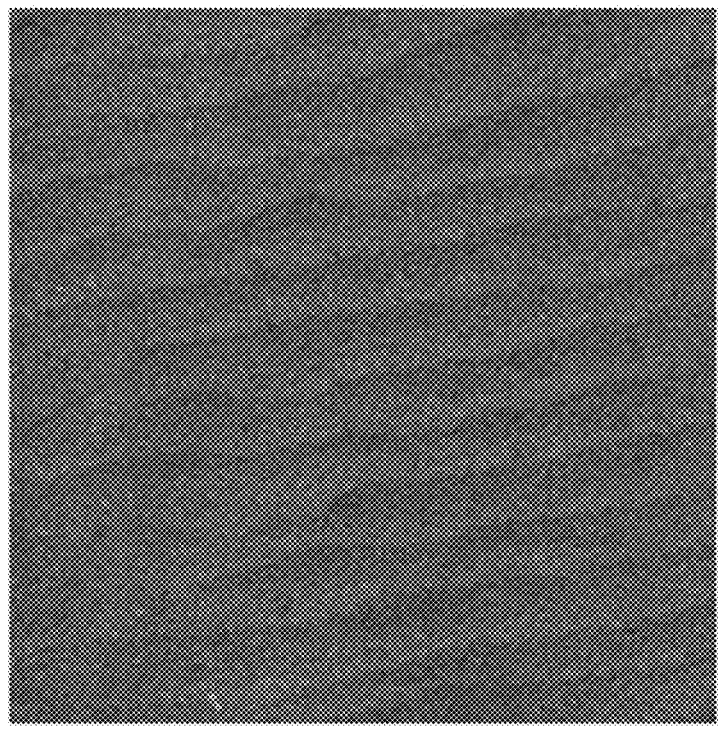
FIG. 12 is an AFM cross-sectional view illustrating a surface of a dielectric which is formed by a method of forming a dielectric according to a comparative example.
Figure 13:
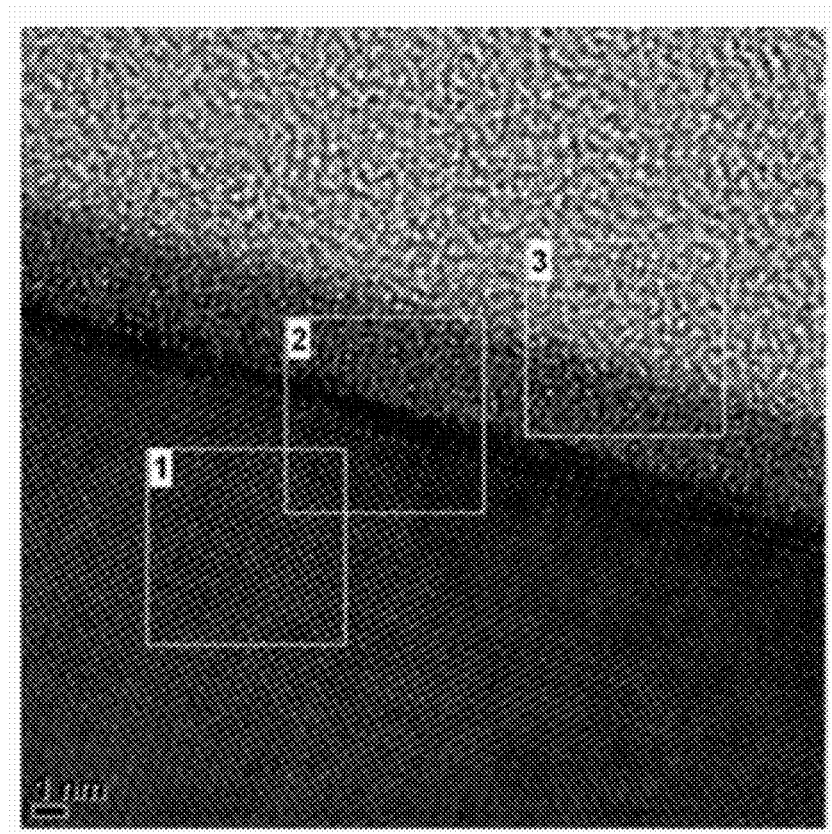
FIG. 13 is an TEM cross-sectional view illustrating a substrate and the dielectric which is formed by the method of forming a dielectric according to a comparative example.
Figure 14:
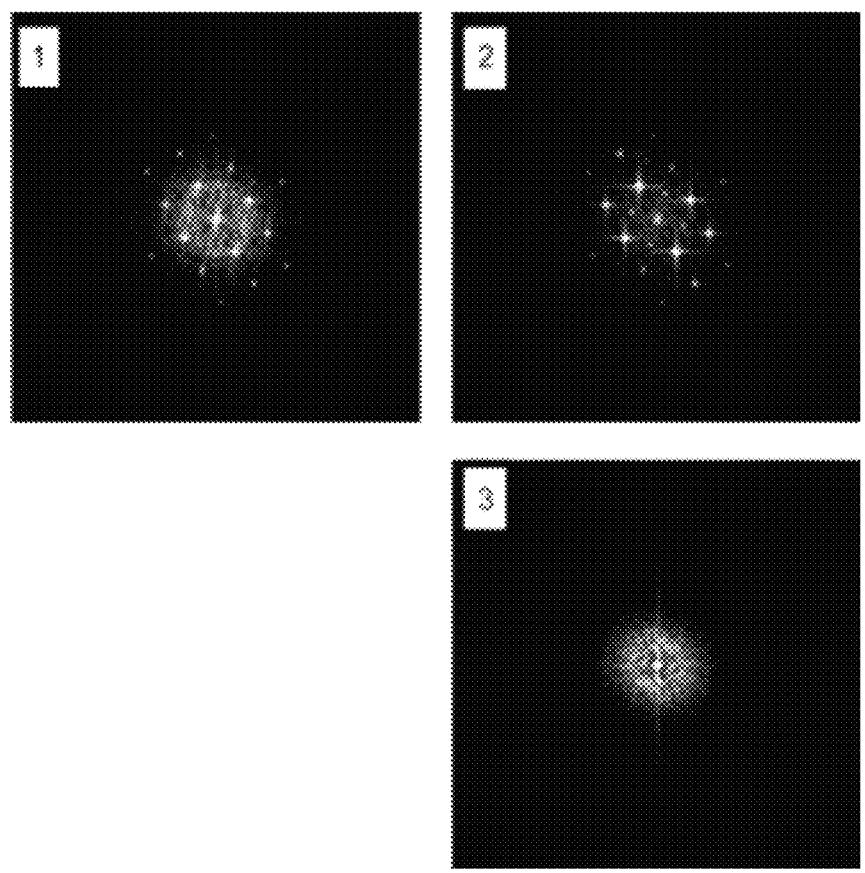
FIG. 14 is an enlarged view illustrating partial regions of the cross-sectional view shown in FIG. 13.

FIG. 12 is an AFM cross-sectional view illustrating a surface of a dielectric which is formed by a method of forming a dielectric according to a comparative example. FIG. 13 is a TEM cross-sectional view illustrating a substrate and a dielectric which is formed by a method of forming a dielectric according to a comparative example. FIG. 14 is an enlarged view illustrating partial regions of the cross-sectional view of FIG. 13.

Unlike the method of forming a dielectric according to the example embodiments in which a pre-deposition time of about 180 seconds is applied to form the dielectric 50 shown in FIGS. 7 and 9, the method of forming a dielectric according to the comparative example shown in FIG. 12 may have a pre-deposition time of about 10 seconds.

Referring to FIG. 12, the surface roughness Rq of the dielectric formed by the method of forming a dielectric according to the comparative example is about 2.5 Å and is less than the surface roughness Rq of the dielectric 50 shown in FIG. 9, which is about 3.2 Å. However, the dielectric shown in FIG. 12 may include an amorphous phase as shown in FIGS. 13 and 14. In other words, when a sufficient pre-deposition time is not applied, it may be difficult for the dielectric to grow epitaxially on the substrate.

For example, referring to FIG. 13, a first region 1 shows a cross-section of the substrate. A second region 2 shows a cross-section of a portion between the substrate and the dielectric. A third region 3 shows a cross-section of the dielectric. As shown in FIG. 14, the arrangement structure of the substrate in the first region 1 is different from the arrangement structure of the dielectric in the third region 3. In other words, significant lattice misfit may occur between the substrate and the dielectric. Therefore, it may be difficult for the dielectric to grow epitaxially on the substrate.

Figure 15:
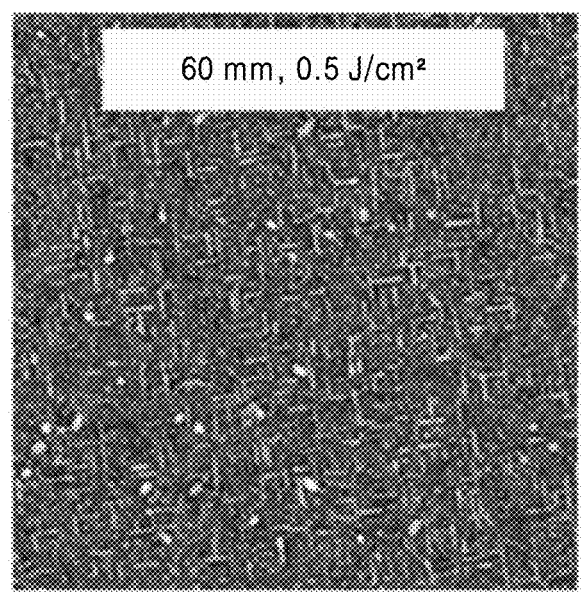
FIG. 15 is an AFM cross-sectional view illustrating a surface of a dielectric which is formed by a method of forming a dielectric according to another comparative example.
Figure 16:
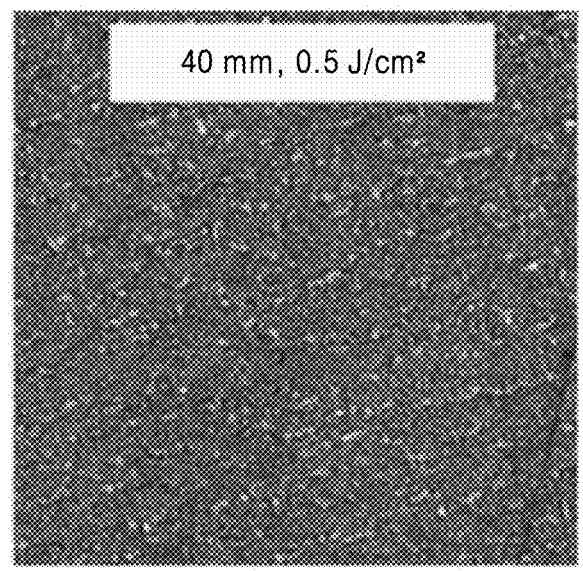
FIG. 16 is an AFM cross-sectional view illustrating a surface of a dielectric which is formed by a method of forming a dielectric according to another comparative example.

FIG. 15 is an AFM cross-sectional view illustrating a surface of a dielectric which is formed by a method of forming a dielectric according to another comparative example. FIG. 16 is an AFM cross-sectional view illustrating a surface of a dielectric which is formed by a method of forming a dielectric according to another comparative example.

Unlike the method of forming the dielectric 50 shown in FIGS. 7 and 9 according to the embodiment in which the laser light source 20 (refer to FIG. 3) having an energy density of about 0.4 J/cm$^2$ is used when the distance D1 (refer to FIG. 3) between the target material 30 (refer to FIG. 3) and the substrate 40 (refer to FIG. 3) is about 60 mm, the method of forming a dielectric according to the comparative example shown in FIG. 15 may use a laser light source 20 (refer to FIG. 3) having an energy density of about 0.5 J/cm$^2$. In this case, the distance D1 between the target material 30 and the substrate 40 may be about 60 mm, which is the same distance D1 in the method of forming the dielectric shown in FIGS. 9 and 10-11.

In addition, the method of forming a dielectric according to the comparative example shown in FIG. 16 may use a laser light source 20 having an energy density of about 0.5 J/cm$^2$. In this case, the distance D1 between the target material 30 and the substrate 40 may be about 40 mm, which is less than the distance D1 in the method of forming the dielectric 50 shown in FIGS. 9 and 10-11.

When the energy density of the laser light source 20 is excessively high, the surface roughness of the dielectric may increase. For example, referring to FIG. 15, the surface roughness Rq of the comparative dielectric formed by the method of forming a dielectric according to the comparative example is about 6.9 Å, which is greater than the surface roughness Rq of the dielectric 50 shown in FIG. 9, which is about 3.2 Å.

When the energy density of the laser light source 20 is excessively high, even though the distance D1 between the target material 30 and the substrate 40 is decreased, the dielectric may not be epitaxially grown on the substrate 40. For example, referring to FIG. 16, the surface roughness Rq of the comparative dielectric, which is formed by the method of forming a dielectric according to the comparative example, is about 5.1 Å. The surface roughness Rq of the comparative dielectric shown in FIG. 16 is less than the surface roughness Rq of the comparative dielectric shown in FIG. 15, which is about 6.9 Å. However, the comparative dielectric shown FIG. 16 may not have a step terrace structure. This may be evidence that the comparative dielectric shown in FIG. 16 is not epitaxially grown on the substrate 40.

Figure 17:
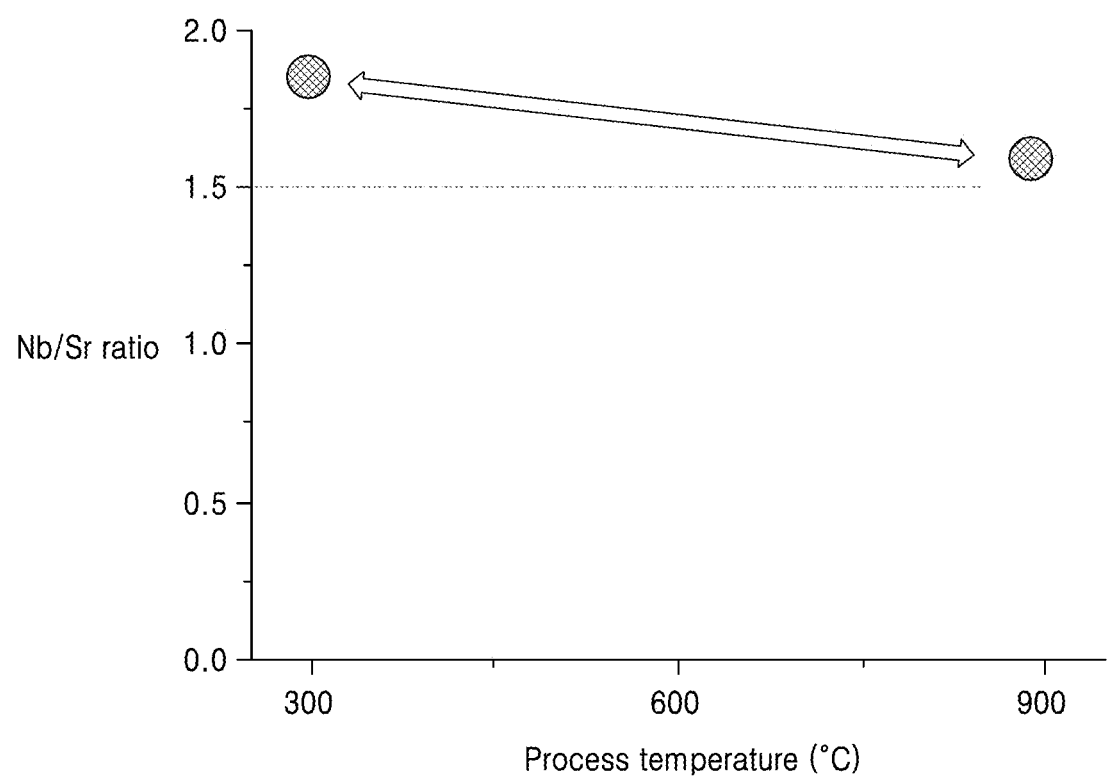
FIG. 17 is a graph schematically illustrating an example chemical composition ratio of the dielectric of FIG. 7 with respect to process temperature.

FIG. 17 is a graph schematically illustrating an example chemical composition ratio of the dielectric 50 of FIG. 7 with respect to process temperature.

Referring to FIG. 17, when the dielectric 50 is represented by the formula of R$_A$M$_B$O$_C$ and where R is strontium (Sr) and M is niobium (Nb), the composition ratio of R to M (e.g., Nb/Sr) may vary depending on the process temperature. For example, the process temperature may affect the ratio B/A. The process temperature may be, for example, the temperature of the substrate 40 (refer to FIG. 7), which is heated during a process for the dielectric 50. For example, the substrate 40 may be heated using a heating coil and/or plate. The substrate 40 may be heated before the deposition of the target material 30, and the temperature may be maintained during the formation of the dielectric 50. In some embodiments, when the process temperature is about 900° C., the composition ratio of Nb to Sr (Nb/Sr) may be about 1.5. However, in a comparative example, when the process temperature is about 300° C., the composition ratio of Nb to Sr (Nb/Sr) may be about 1.8. In some embodiments, to adjust the composition ratio of Nb to Sr (Nb/Sr) to be about 1.5, a process temperature of about 800° C. to about 1000° C. may be appropriate.

Figure 18:
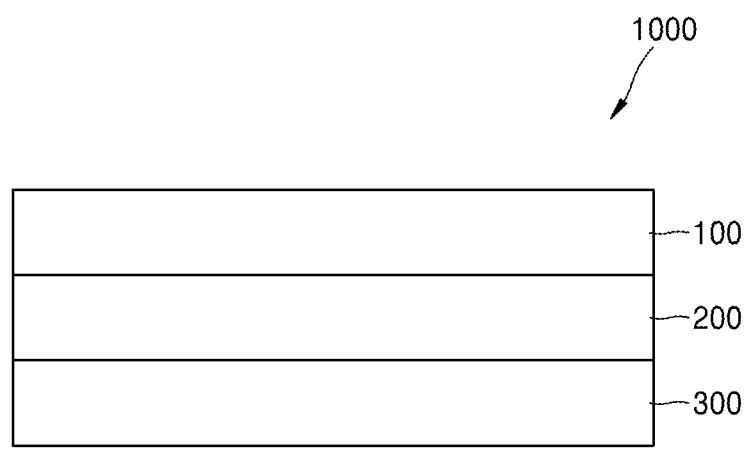
FIG. 18 is a view schematically illustrating the structure of a capacitor according to some embodiments.
Figure 19:
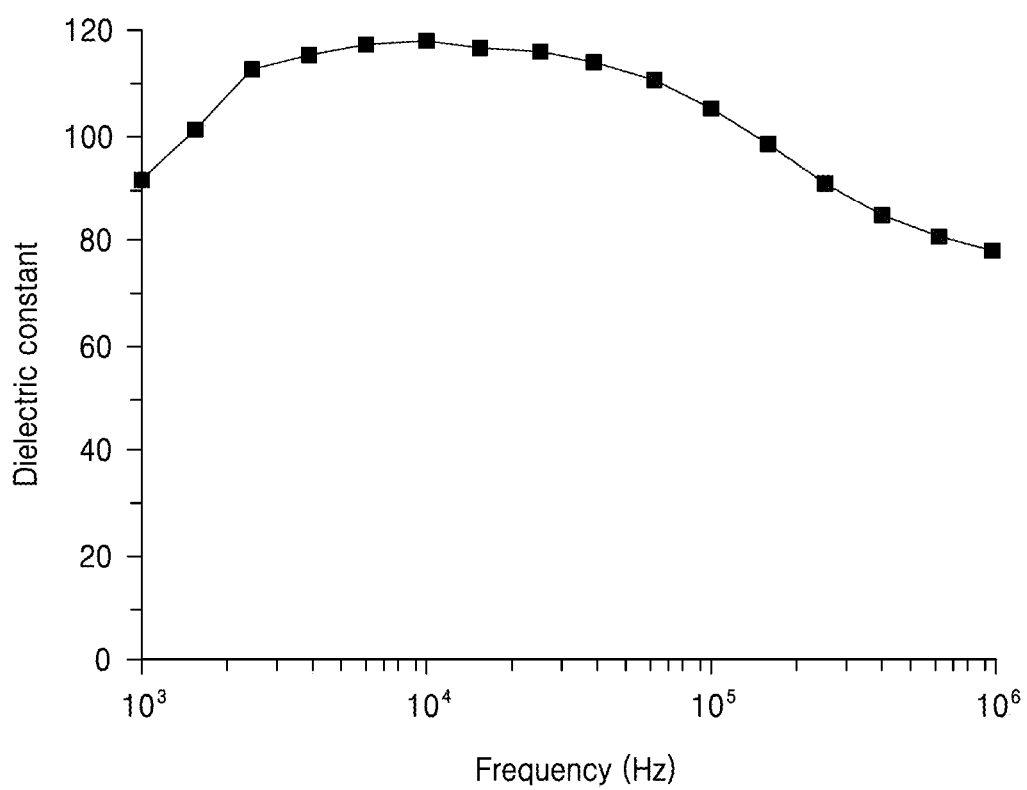
FIG. 19 is a graph illustrating dielectric constant characteristics of an example capacitor as shown FIG. 18.

FIG. 18 is a view schematically illustrating the structure of a capacitor 1000 according to some embodiments. FIG. 19 is a graph illustrating dielectric constant characteristics of an example capacitor 1000 as shown in FIG. 18. FIG. 19 shows measured values of the dielectric constant of the example capacitor 1000 when the capacitor 1000 includes a first electrode 100 containing platinum (Pt), a dielectric 200 having a thickness of about 10 nm, and a second electrode 300 containing SrTiO$_3$ doped with niobium (Nb).

Referring to FIG. 18, the capacitor 1000 may include the first electrode 100, the dielectric 200 provided on a lower portion of the first electrode 100, and the second electrode 300 provided on a lower portion of the dielectric 200. The dielectric 200 may be between the first electrode 100 and the second electrode 300. The first electrode 100 and the second electrode 300 may function as an upper electrode and a lower electrode. The first electrode 100 and the second electrode 300 may be electrically isolated from each other (e.g., not electrically connected to each other).

For example, the first electrode 100 may include strontium-ruthenium oxide (SrRuO$_3$), iridium-ruthenium oxide (SrIrO$_3$), calcium-ruthenium oxide (CaRuO$_3$), calcium-nickel oxide (CaNiO$_3$), barium-ruthenium oxide (BaRuO$_3$), barium-strontium-ruthenium oxide ((Ba,Sr)RuO$_3$), iridium (Ir), an iridium-ruthenium (IrRu) alloy, iridium oxide (IrO$_2$), titanium-aluminum nitride (TiAlN), titanium oxide (TiO$_2$), ruthenium (Ru), platinum (Pt), gold (Au), silver (Ag), copper (Cu), iron (Fe), tin (Ti), zinc (Zn), aluminum (Al), indium (In), chromium (Cr), lithium (Li), sodium (Na), potassium (K), cesium (Cs), calcium (Ca), magnesium (Mg), palladium (Pd), molybdenum (Mo), zirconium oxide (ZrO$_2$), tin oxide (SnO$_2$), indium-tin oxide (ITO), and/or the like. However, the material of the first electrode 100 is not limited thereto, and the first electrode 100 may include any electrode material used in the art. For example, the first electrode 100 may include any one of the listed materials or a combination of the listed materials. For example, the first electrode 100 may be formed on the dielectric 200 by depositing a metal, a metal oxide, a metal nitride, a metal nitrate, and/or an alloy on the dielectric 200 through an electron-beam deposition process, a chemical vapor deposition process, a sputtering process, an atomic layer deposition process, a pulsed laser deposition process, and/or the like. The first electrode 100 may include a single-layer structure and/or a multilayer structure. The metal may include platinum, gold, silver, copper, iron, tin, zinc, aluminum, indium, chromium, lithium, sodium, potassium, cesium, calcium, magnesium, palladium, molybdenum, and/or the like.

The dielectric 200 may be substantially the same as the dielectric 50 shown in FIG. 7. For example, the dielectric 200 may include an oxide represented by R$_A$M$_B$O$_C$ (where R is a divalent element, and M is a pentavalent element) and having a perovskite-type crystal structure. The formula of R$_A$M$_B$O$_C$ may satisfy the conditions of 1.3<B/A<1.7 and 9.0≤C<10.0. The dielectric 200 may have a nanoscale three-dimensional shape. For example, the dielectric 200 may not have a layered structure. Therefore, the dielectric 200 may have improved permittivity and reliability/stability.

The second electrode 300 may be substantially the same as the substrate 40 shown in FIG. 7. For example, in some embodiments, the second electrode 300 may serve as a seed layer on which the dielectric 200 is formed. In this case, the lattice misfit between the second electrode 300 and the dielectric 200 may be about 1% or less. For example, the lattice constant of the second electrode 300 may be in the range of about 3.85 Å to about 3.95 Å. In some embodiments, the second electrode 300 may include at least one of SrTiO$_3$ and/or Nb-doped SrTiO$_3$.

Referring to FIG. 19, the dielectric constant of the capacitor 1000 may be about 80 to about 120 when the charging/ discharging frequency for the capacitor 1000 is within the range of 1 kHz to 1000 kHz. For example, the dielectric constant of the capacitor 1000 may be about 105 when the charging/discharging frequency for the capacitor 1000 is 100 kHz.

Figure 20:
FIG. 20 is a view schematically illustrating the structure of a capacitor according to some embodiments.

FIG. 20 is a view schematically illustrating the structure of a capacitor 1001 according to another embodiment.

Referring to FIG. 20, the capacitor 1001 may include a first electrode 101, a dielectric 201 provided on a lower portion of the first electrode 101, and a second electrode 301 only provided on a lower portion of the dielectric 201. In addition, the capacitor 1001 may further include a seed layer 401 provided between the second electrode 301 and the dielectric 201. The dielectric 201 may be between the first electrode 101 and the second electrode 301. The first electrode 101 and the second electrode 301 may function as an upper electrode and a lower electrode, respectively. The first electrode 101 and the second electrode 301 may be electrically isolated from each other (e.g., not electrically connected to each other).

For example, at least one of the first electrode 101 and the second electrode 301 may include strontium-ruthenium oxide ($SrRuO_3$), iridium-ruthenium oxide ($SrIrO_3$), calcium-ruthenium oxide ($CaRuO_3$), calcium-nickel oxide ($CaNiO_3$), barium-ruthenium oxide ($BaRuO_3$), barium-strontium-ruthenium oxide (($Ba,Sr$)$RuO_3$), iridium (Ir), an iridium-ruthenium (IrRu) alloy, iridium oxide ($IrO_2$), titanium-aluminum nitride (TiAlN), titanium oxide ($TiO_2$), ruthenium (Ru), platinum (Pt), gold (Au), silver (Ag), copper (Cu), iron (Fe), tin (Ti), zinc (Zn), aluminum (Al), indium (In), chromium (Cr), lithium (Li), sodium (Na), potassium (K), cesium (Cs), calcium (Ca), magnesium (Mg), palladium (Pd), molybdenum (Mo), zirconium oxide ($ZrO_2$), tin oxide ($SnO_2$), indium-tin oxide (ITO), or the like. However, the first electrode 101 and the second electrode 301 are not limited thereto, and the first electrode 101 and the second electrode 301, in this case, may include any electrode material used in the art. For example, the first electrode 101 and the second electrode 301 may include any one of the listed materials and/or a combination of the listed materials. For example, the first electrode 101 and the second electrode 301 may be formed using a metal, a metal oxide, a metal nitride, a metal nitrate, and/or an alloy. The metal may include platinum, gold, silver, copper, iron, tin, zinc, aluminum, indium, chromium, lithium, sodium, potassium, cesium, calcium, magnesium, palladium, molybdenum, and/or the like.

The dielectric 201 may be substantially the same as the dielectric 50 shown in FIG. 7. For example, the dielectric 201 may include an oxide represented by $R_AM_BO_C$ (where R is a divalent element, M is a pentavalent element) and having a perovskite-type crystal structure. The dielectric 201 may have a nanoscale three-dimensional shape. For example, the dielectric 201 may not have a layered structure.

The seed layer 401 may be substantially the same as the substrate 40 shown in FIG. 7. For example, the seed layer 401 may serve as a seed layer on which the dielectric 201 is formed. The lattice misfit between the seed layer 401 and the dielectric 201 may be about 1% or less. For example, the lattice constant of the seed layer 401 may be in the range of about 3.85 Å to about 3.95 Å. For example, the seed layer 401 may include at least one of $SrTiO_3$ and Nb-doped $SrTiO_3$.

Because the capacitors 1000 and 1001 shown in FIGS. 18 and 20 include the dielectrics 200 and 201 as described above, the dielectric characteristics and capacitance of the capacitors 1000 and 1001 are improved, and thus, the electrical characteristics of the capacitors 1000 and 1001 are improved. The capacitors 1000 and 1001 may be independent devices. However, the capacitors 1000 and 1001 are not limited thereto. For example, the capacitors 1000 and 1001 may be included as parts of memory devices. For example, the capacitors 1000 and 1001 may be metal-insulator-metal (MIM) capacitors mounted on memory devices.

The above-described various embodiments are only examples, and those of ordinary skill in the art may understand that various modifications and equivalent other embodiments are possible therefrom. Therefore, the scope of the various example embodiments should be determined by the technical idea of the following claims.

As described above, according to the one or more of the above embodiments, capacitors having improved capacitance may be provided by employing dielectrics having improved dielectric constant characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A dielectric having a three-dimensional nanoscale shape, the dielectric comprising:
    an oxide including a nanoscale three-dimensional (3D) perovskite-type crystal structure, the oxide represented by $R_AM_BO_C$ where R is a divalent element, M is a pentavalent element, $1.3<B/A<1.7$, and $9.0 \leq C < 10.0$,
    wherein the dielectric is electrically neutral, and
    wherein the oxide is electrically neutral.

2. The dielectric of claim 1, wherein, the divalent element comprises at least one of calcium (Ca), strontium (Sr), barium (Ba), or a combination thereof.

3. The dielectric of claim 1, wherein, the pentavalent element comprises at least one of niobium (Nb), vanadium (V), tantalum (Ta), or a combination thereof.

4. The dielectric of claim 1, wherein the oxide has a lattice constant of about 3.85 Å to about 3.95 Å.

5. The dielectric of claim 1, wherein the oxide has a thickness of about 1.5 nm to about 1000 nm.

6. A capacitor comprising:
    a first electrode;
    a second electrode; and
    the dielectric of claim 1 between the first electrode and the second electrode.

7. The capacitor of claim 6, further comprising:
    a seed layer between the second electrode and the oxide, the seed layer having a lattice misfit of 1% or less with respect to the oxide.

8. The capacitor of claim 6, wherein the second electrode is a seed layer for the oxide, and the second electrode has a lattice misfit of about 1% or less with respect to the oxide.

* * * * *